United States Patent
Srivastava et al.

(12) 
(10) Patent No.: US 11,646,217 B2
(45) Date of Patent: May 9, 2023

(54) TRANSFER APPARATUS AND SUBSTRATE-SUPPORTING MEMBER

(71) Applicant: Applied Materials, Inc., Santa Clara, CA (US)

(72) Inventors: Anubhav Srivastava, Bangalore (IN); Bhaskar Prasad, Jamshedpur (IN); Kirankumar Neelasandra Savandaiah, Bangalore (IN); Thomas Brezoczky, Los Gatos, CA (US); Srinivasa Rao Yedla, Bangalore (IN); Lakshmikanth Krishnamurthy Shirahatti, Bangalore (IN)

(73) Assignee: APPLIED MATERIALS, INC., Santa Clara, CA (US)

( * ) Notice: Subject to any disclaimer, the term of this patent is extended or adjusted under 35 U.S.C. 154(b) by 268 days.

(21) Appl. No.: 17/230,775

(22) Filed: Apr. 14, 2021

(65) Prior Publication Data
US 2022/0336248 A1 Oct. 20, 2022

(51) Int. Cl.
*H01L 21/683* (2006.01)
*H01L 21/677* (2006.01)

(52) U.S. Cl.
CPC .... *H01L 21/6833* (2013.01); *H01L 21/67742* (2013.01)

(58) Field of Classification Search
CPC ......... H01L 21/67161; H01L 21/67742; H01L 21/6831; H01L 21/6833; H01L 21/68707
(Continued)

(56) References Cited

U.S. PATENT DOCUMENTS 6,007,675 A * 12/1999 Toshima ................. C23C 16/54
134/52
2010/0178135 A1* 7/2010 Laceky ............. H01L 21/68707
414/217
(Continued)

FOREIGN PATENT DOCUMENTS

EP 1056124 A2 * 11/2000 ............. H01L 21/68
WO WO-2011055822 A1 * 5/2011 ....... H01L 21/67742

OTHER PUBLICATIONS

Machine translation of Ishizawa et al. International Patent Document WO 2011/055822 A1 May 12, 2011 (Year: 2011).*

*Primary Examiner* — Kevin J Comber
(74) *Attorney, Agent, or Firm* — Patterson + Sheridan, LLP (57) ABSTRACT

Embodiments of the present disclosure generally relate to methods and apparatus for processing substrates. More specifically, embodiments of the present disclosure relate to transfer apparatus and substrate-supporting members. In an embodiment, an apparatus for transferring a substrate is provided. The apparatus includes a hub and a plurality of transfer arms extending from the hub. The apparatus further includes a plurality of substrate-supporting members, wherein each of the transfer arms has a first end coupled to the hub and a second end coupled to a respective one of the plurality of substrate-supporting members. The apparatus further includes a first electrical interface connection for electrostatically chucking a substrate and located at a first position on each substrate-supporting member, and a second electrical interface connection for electrostatically chucking the substrate and located at a second position on each substrate-supporting member. Substrate processing modules are also described.

14 Claims, 8 Drawing Sheets

(58) Field of Classification Search
USPC .......................................................... 361/234
See application file for complete search history.

(56) References Cited

U.S. PATENT DOCUMENTS

2011/0226178 A1\* 9/2011 Tsuji ................. H01L 21/02164
                                                                                    118/50
2022/0013382 A1    1/2022  Prasad et al.

\* cited by examiner

TRANSFER APPARATUS AND SUBSTRATE-SUPPORTING MEMBER

BACKGROUND

Field

Embodiments of the present disclosure generally relate to methods and apparatus for processing substrates. More specifically, embodiments of the present disclosure relate to transfer apparatus and substrate-supporting members.

Description of the Related Art

Conventional cluster tools are configured to perform one or more processes during substrate processing. For example, a cluster tool can include a physical vapor deposition (PVD) chamber for performing a PVD process on a substrate, an atomic layer deposition (ALD) chamber for performing an ALD process on a substrate, a chemical vapor deposition (CVD) chamber for performing a CVD process on a substrate, and/or one or more other processing chambers.

Precision in substrate handling is a key parameter for uniformity across the processed substrate. Current cluster tools utilize vacuum robots for precise placement and movement of substrates. However, these robots can only transfer two substrates simultaneously and also require multiple sensors for accurate positioning. The restraint on the number of substrates transferred simultaneously limits substrate throughput, while the use of multiple sensors increases costs. Such low throughput and added costs act as a bottleneck for the capacity and capability of conventional cluster tools.

There is a need for new and improved transfer apparatus and substrate-supporting members that overcome one or more deficiencies in the art.

SUMMARY

Embodiments of the present disclosure generally relate to methods and apparatus for processing substrates. More specifically, embodiments of the present disclosure relate to transfer apparatus and substrate-supporting members.

In an embodiment, an apparatus for transferring a substrate is provided. The apparatus includes a hub and a plurality of transfer arms extending from the hub. The apparatus further includes a plurality of substrate-supporting members, wherein each of the transfer arms has a first end coupled to the hub and a second end coupled to a respective one of the plurality of substrate-supporting members. The apparatus further includes a first electrical interface connection for electrostatically chucking a substrate and located at a first position on each substrate-supporting member, and a second electrical interface connection for electrostatically chucking the substrate and located at a second position on each substrate-supporting member.

In another embodiment, an apparatus for transferring a substrate is provided. The apparatus includes a hub and a plurality of transfer arms extending from the hub. The apparatus further includes a plurality of substrate-supporting members, wherein each of the transfer arms has a first end coupled to the hub and a second end coupled to a respective one of the plurality of substrate-supporting members. The apparatus further includes a plurality of electrical interface connections distributed about the substrate-supporting members, the plurality of electrical interface connections for electrostatically chucking a substrate, wherein the hub is rotatable when the plurality of electrical interface connections are electrically connected to a power supply.

In another embodiment, a substrate processing module is provided. The substrate processing module includes a transfer apparatus positioned within a transfer region of the substrate processing module, the transfer region configured to operate under vacuum. The transfer apparatus includes a hub, a plurality of transfer arms extending from the hub, and a plurality of substrate-supporting members, wherein each of the transfer arms has a first end coupled to the hub and a second end coupled to a respective one of the plurality of substrate-supporting members. The transfer apparatus further includes a first electrical interface connection for electrostatically chucking a substrate and located at a first position on each substrate-supporting member and a second electrical interface connection for electrostatically chucking the substrate and located at a second position on each substrate-supporting member.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, as the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to apparatus for substrate processing, and more specifically to transfer apparatus and substrate-supporting members (e.g., substrate holders). The transfer apparatus described herein enables transfer of greater than 2 substrates, e.g., 6 substrates (or more), simultaneously, thereby increasing throughput. Briefly, the transfer apparatus includes a centralized rotary mechanism for moving all of the substrates simultaneously from one station to another. The transfer apparatus includes a plurality of transfer arms coupled to substrate-supporting members having electrical interface connections. The electrical interface connections can provide power to, e.g., substrate contact pads, and the substrate contact pads enable direct current (DC) chucking of the substrates to the substrate-supporting members, thereby facilitating substrate transfer at higher speeds, further increasing throughput.

For substrate positioning on the substrate-supporting members, in some embodiments, the transfer apparatus utilizes a lesser number of sensors relative to conventional systems, thereby reducing complexity and improving the system reliability. In some examples, the substrate-supporting members include an opening for system calibration. The opening can be a clearance that enables positional adjustability of the substrate-supporting members, enabling an initial one-time calibration, and replacing complex active correction robots of conventional systems. Further, embodiments described herein provide improved mechanical droop over existing systems, due to, e.g., the design of the transfer arm. Moreover, and as described herein, controlled heating and cooling of the assembly under, e.g., ultra-high vacuum, results in improved green-to-green time of the system (the time to stop the processing of substrates, perform maintenance (e.g., including venting the system), and start processing the substrates again).

One or more embodiments of the present disclosure are directed towards apparatus for substrate processing and a cluster tool including a transfer apparatus and a plurality of processing stations. In some embodiments, the transfer apparatus is configured as an indexer, and the processing stations may include facilities to enable atomic layer deposition (ALD), chemical vapor deposition (CVD), physical vapor deposition (PVD), etching, cleaning, thermal processing, annealing, and/or polishing processes. Other processing platforms may also be used with the present disclosure at the discretion of a user. The present disclosure generally includes a substrate processing tool that has a high throughput, increased adaptability, and a smaller footprint than conventional cluster tools.

Figure 1:
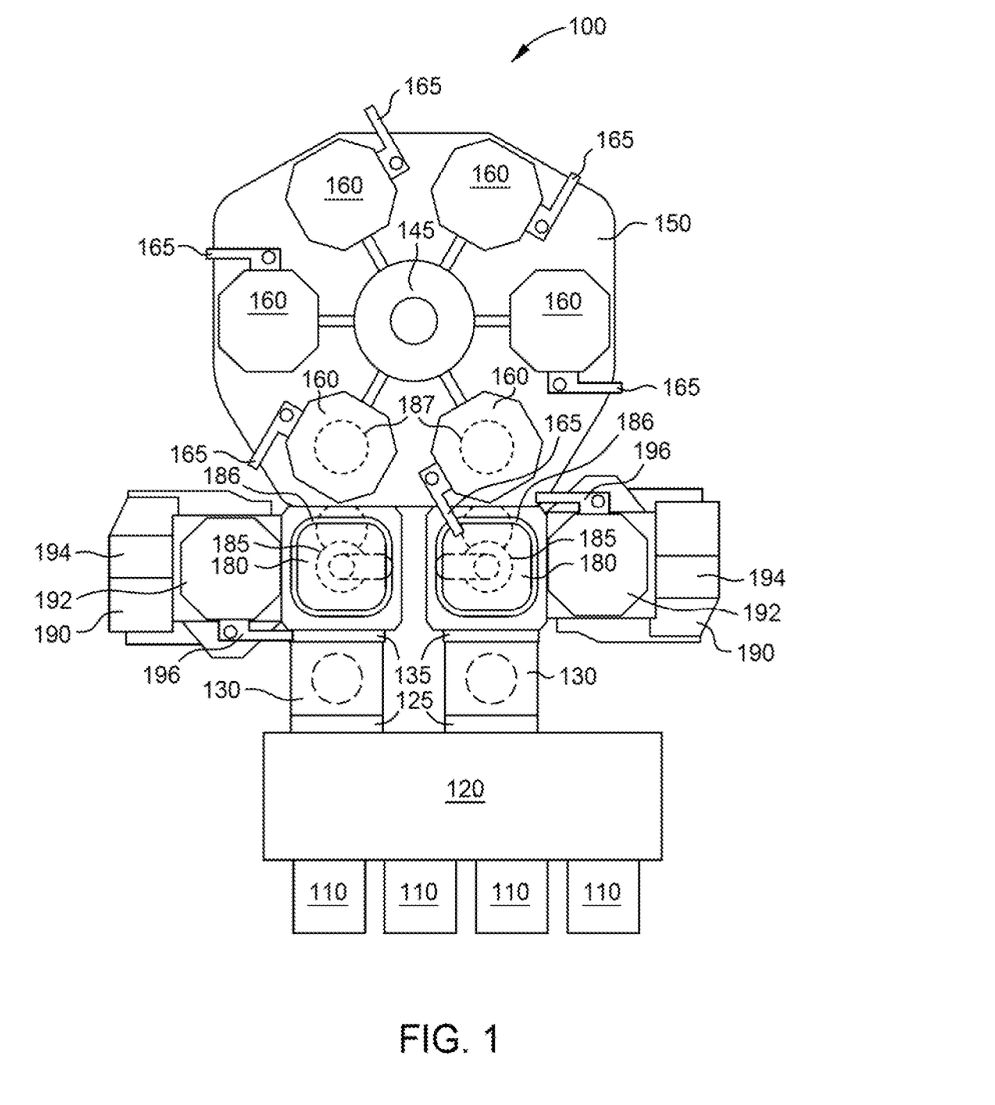
FIG. 1 is a plan view of a processing module according to at least one embodiment of the present disclosure.

FIG. 1 is a plan view of an embodiment of a processing module 100. The processing module 100 includes a plurality of Front Opening Unified Pods (FOUPs) 110, a Factory Interface (FI) 120 adjacent to the FOUPs 110, a plurality of load lock chambers 130 adjacent to the FI 120, a plurality of robot chambers 180 adjacent to the plurality of load lock chambers 130, a plurality of preparation chambers 190 adjacent to the plurality of robot chambers 180, and a transfer chamber assembly 150 adjacent to the plurality of robot chambers 180.

The plurality of FOUPs 110 may be utilized to safely secure and store substrates between movement from different machines. The plurality of FOUPs 110 may vary in quantity depending upon the process and throughput of the system. The FI 120 is disposed between the plurality of FOUPs 110 and the plurality of load lock chambers 130. The FI 120 creates an interface between the factory and the remainder of the processing module 100. The plurality of load lock chambers 130 are connected to the FI 120 by first slit valves 125 (e.g., gate valves), such that a substrate may be transferred from the FI 120 to the plurality of load lock chambers 130 through the first slit valves 125 and from the plurality of load lock chambers 130 to the FI 120. The first slit valves 125 may be on one wall of the load lock chambers 130. In some embodiments, the first slit valves 125 may be fluid isolation valves and may form a seal between the FI 120 and the load lock chambers 130. This seal may keep outside contaminants from entering the processing module 100. The load lock chambers 130 also comprise a second slit valve 135 on an opposite wall from the first slit valve 125. The second slit valve 135 may interface the load lock chambers 130 with the robot chambers 180.

The transfer chamber assembly 150 includes a central transfer apparatus 145 and a plurality of process stations 160. The plurality of process stations 160 are disposed around the central transfer apparatus 145, such that the plurality of process stations 160 are disposed radially outward of the central transfer apparatus 145 in the transfer chamber assembly 150.

The robot chambers 180 may be on one side of the load lock chambers 130, such that the load lock chambers 130 are between the FI 120 and the robot chambers 180. The robot chambers 180 include a transfer robot 185. The transfer robot 185 may be any robot suitable to transfer one or more substrates to and from positions within a load lock chamber 130, preparation chamber 190, and process station 160 of the processing module 100. The transfer robot 185 can be utilized to transfer substrates 186 to a substrate-supporting component, such as a chuck assembly 187 that is temporarily connected to or positioned on a portion of the central transfer apparatus 145.

The chuck assembly 187 holds a single substrate 186 and travels with the substrate 186 into each of the process stations 160 as they are moved by the central transfer apparatus 145 within the transfer chamber assembly 150. The chuck assembly 187, when disposed at one of the process stations 160 (with a substrate thereon), forms a boundary of the process station 160. The substrates 186 are mated with one of chuck assemblies 187, and the substrate 186 moves in and between the process stations 160 on that chuck assembly 187.

In some embodiments, the transfer robot 185 is configured to transport substrates from the load lock chambers 130 and into the plurality of preparation chambers 190. The transfer robot 185 removes the substrate from the load lock chamber 130, moves the substrate into the robot chamber 180, and then moves the substrate into the preparation chamber 190. The transfer robot 185 may also be configured to move substrates to the transfer chamber assembly 150. Similarly to how the substrate may be moved to the preparation chambers 190 from the load lock chambers 130 by the transfer robot 185, the substrate may also be moved from the preparation chamber 190 to the load lock chambers 130 by the transfer robot 185. The transfer robot 185 may also move substrates from the transfer chamber assembly 150 to the preparation chambers 190 or the load lock chambers 130. In some alternative embodiments, the transfer robot 185 may move a substrate from the load lock chambers 130, move the substrate into the robot chamber 180, and then move the substrate into the transfer chamber assembly 150. In this alternative embodiment, the substrate may not enter the preparation chamber 190 either before processing in the transfer chamber assembly 150 or after processing in the transfer chamber assembly 150.

The preparation chambers 190 may include a processing chamber 192, a packaging structure 194, and a cleaning chamber vacuum pump 196. The processing chamber 192 may be any one of a pre-clean chamber, an anneal chamber, or a cool down chamber, depending upon the desired process that is to be performed within this portion of the processing module 100. In some embodiments, the processing chamber 192 may be a wet clean chamber. In other embodiments, the processing chamber 192 may be a plasma clean chamber. In yet other exemplary embodiments, the processing chamber 192 may be a Si, Co, Ni preclean or Preclean II chamber available from Applied Materials, Inc., of Santa Clara, Calif.

The packaging structure 194 may be a structural support for the processing chamber 192. The packaging structure 194 may include a sub-transfer chamber (not shown), a gas supply (not shown), and an exhaust port (not shown). The packaging structure 194 may provide the structure around the processing chamber 192 and interface the processing chamber 192 to the robot chamber 180. The cleaning chamber vacuum pump 196 is disposed adjacent to a wall of the processing chamber 192 and provides control of the pressure within the processing chamber 192. There may be one chamber vacuum pump 196 adjacent to each of the processing chambers 192. The chamber vacuum pump 196 may be configured to provide a pressure change to the processing chamber 192. In some embodiments, the chamber vacuum pump 196 is configured to increase the pressure of the processing chamber 192. In other embodiments, the chamber vacuum pump 196 is configured to decrease the pressure of the processing chamber 192, such as to create a vacuum within the processing chamber 192. In yet other embodiments, the chamber vacuum pump 196 is configured to both increase and decrease the pressure of the processing chamber 192 depending on the process being utilized within the processing module 100. The cleaning chamber vacuum pump 196 may be held in place by the packaging structure 194, such that the packaging structure 194 at least partially surrounds the cleaning chamber vacuum pump 196.

The load lock chambers 130, robot chambers 180, and preparation chambers 190 may be arranged to reduce the footprint required for the processing module 100. In one embodiment, one load lock chamber 130 is attached to a first wall of the robot chamber 180. One preparation chamber 190 may be attached to a second wall of the robot chamber 180. The first and second walls may be adjacent walls on the robot chamber 180. In some embodiments, the robot chamber 180 is roughly rectangular shaped. In other embodiments, the robot chamber 180 may be another quadrilateral. In yet other embodiments, the robot chambers 180 may be any desired shape, such as any polygonal shape or a round shape, such as a circle. In an embodiment where the robot chambers 180 are a rectangular or another quadrilateral shape, the first wall and the second wall may be adjacent walls, such that the two walls intersect each other. There may be two load lock chambers 130, two robot chambers 180, and two preparation chambers 190. The two load lock chambers 130, two robot chambers 180, and two preparation chambers 190, when arranged as described above, may form two transport assemblies. The two transport assemblies may be spaced from each other and may form mirror images of one another, such that the preparation chambers 190 are on opposite walls of their respective robot chambers 180 as shown in FIG. 1.

The transfer chamber assembly 150 is positioned adjacent to the robot chambers 180, such that the transfer chamber assembly 150 is connected to the robot chambers 180 by a slit valve (not shown). The transfer chamber assembly 150 may be attached to a third wall of the robot chambers 180. The third wall of the robot chambers 180 may be opposite the first wall of the robot chambers 180.

A chamber pump 165 may be disposed adjacent to each of the process stations 160, such that there are a plurality of chamber pumps 165 disposed around the central transfer apparatus 145. The plurality of chamber pumps 165 may also be disposed radially outward of the central transfer apparatus 145 in the transfer chamber assembly 150. There may be one chamber pump 165 for each of the process stations 160, such that one chamber pump 165 is configured to adjust the pressure within the process station 160 that they are in fluid communication with during operation. In some embodiments, there may be multiple chamber pumps 165 per process station 160. In yet other embodiments, a process station 160 may not have a chamber pump 165. In some embodiments, the chamber pumps 165 are configured to increase the pressure of the process station 160. In other embodiments, the chamber pumps 165 are configured to decrease the pressure of the process station 160, such as to create a vacuum within the process station 160. In yet other embodiments, the chamber pumps 165 are configured to both increase and decrease the pressure of the process stations 160 depending on the process being utilized within the processing module 100.

In some embodiments, there are two to twelve process stations 160 within the transfer chamber assembly 150, such as four to eight process stations 160. In some embodiments, there may be four process stations 160. In other embodiments, as shown in FIG. 1, there are six process stations 160. The number of process stations 160 may impact the total footprint of the processing module 100, the number of possible process steps capable of being performed by the processing module 100, the total fabrication cost of the processing module 100, and the throughput of the processing module 100. Utilizing six process stations 160 reduces the total footprint of the transfer chamber assembly 150, while increasing the throughput the transfer chamber assembly 150 is capable of handling. However, other quantities of process stations 160 can be used as desired by the user.

It has been found that substrate processing sequences that are used to form a repeating stacked layer configuration, wherein the stacked layer deposition processes (e.g., processes for forming multiple thin film layers) have similar chamber processing times, a significant throughput increase and improved cost of ownership (CoO) has been observed when using the one or more system configurations and methods disclosed herein. However, in process sequences used to form next generation devices, which include multi-layer film stacks like On chip Inductor, optical film stacks, hard mask, patterning and memory applications, it is believed that, due to the number of layers that are to be formed and the similar processing times used to form each of the layers, a six or a twelve process station containing the processing module configuration can improve substrate throughput, system footprint, and CoO over more conventional designs known in the art. In one example, it has been found that substrate processing sequences that include stacked layer deposition processes that have processing times less than 90 seconds, such as between 5 seconds and 90 seconds, in combination with the addition of lower substrate transferring overhead times achieved using the system architecture described herein, has a significant advantage over current conventional processing system designs.

The plurality of process stations 160 can be any one of PVD, CVD, ALD, etch, cleaning, heating, annealing, and/or polishing platforms. In some embodiments, the plurality of process stations 160 can all have similar platform interface and process chamber configurations. In other embodiments, the plurality of process stations 160 can include two or more types of process chamber configurations. In one exemplary embodiment, all of the plurality of process stations 160 are PVD process chambers. In another exemplary embodiment, the plurality of process stations 160 includes both PVD and CVD process chambers. Other embodiments of the makeup of the plurality of process stations may be envisioned. The plurality of process stations 160 can be altered to match the types of process chambers needed to complete a process.

The central transfer apparatus 145 may be disposed in the center of the transfer chamber assembly 150, such that the central transfer apparatus 145 is disposed around a central axis of the transfer chamber assembly 150. The central transfer apparatus 145, may be any suitable transfer device. The central transfer apparatus 145 is configured to transport substrates between each of the process stations 160.

Figure 2A:
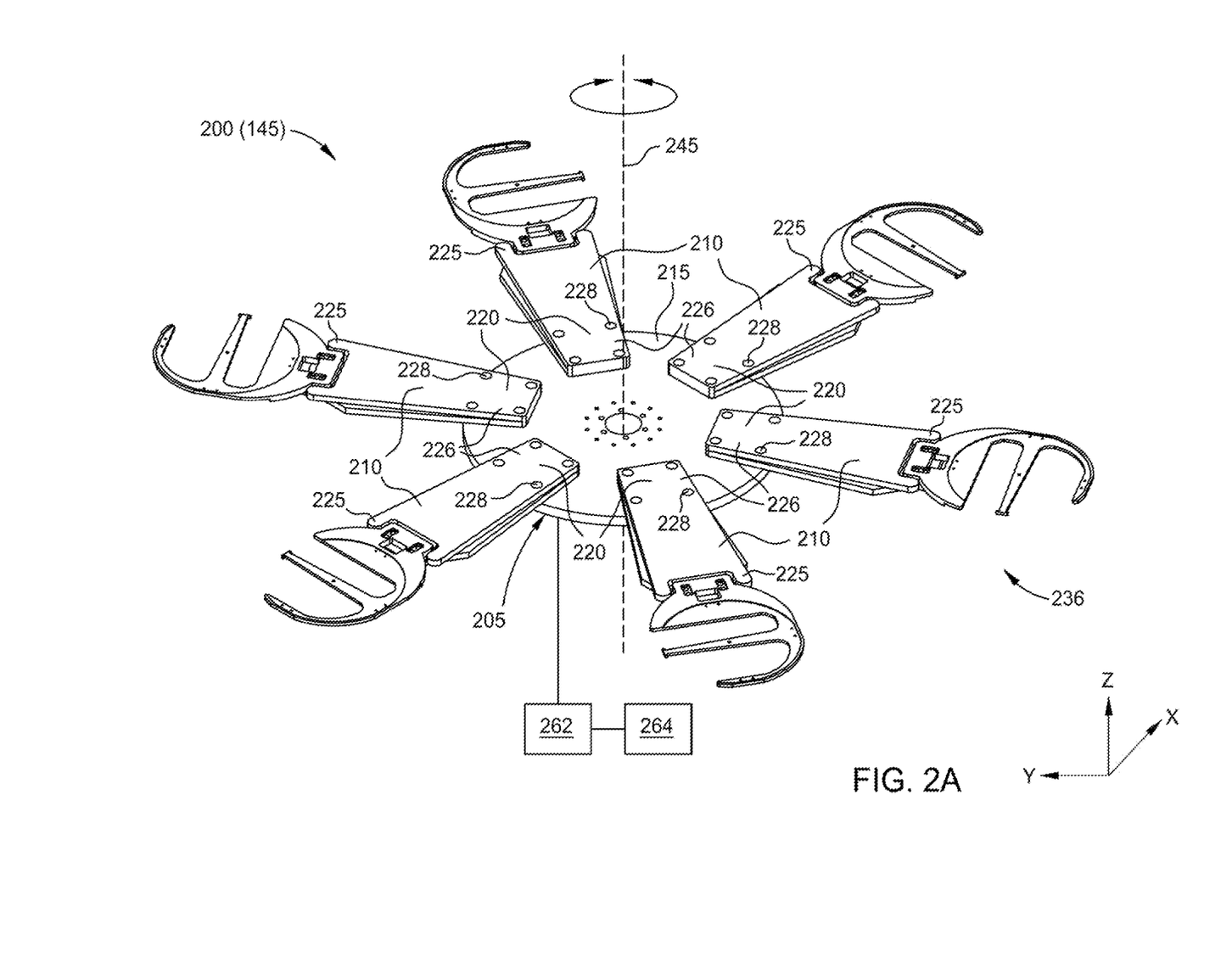
FIG. 2A is an isometric view of one embodiment of an indexer that may be used in the central transfer apparatus of FIG. 1 according to at least one embodiment of the present disclosure.

FIG. 2A is an isometric view of one embodiment of a central transfer apparatus 145 that includes an indexer 200. The indexer 200 may be used in the central transfer apparatus 145 of FIG. 1 according to embodiments of the disclosure described herein. The indexer 200 includes a hub 205 and a plurality of transfer arms 210. Each of the transfer arms 210 may be positionable relative to the hub 205 (e.g., in the X direction, the Y direction, and the Z direction, and combinations thereof). Each of the transfer arms 210 may also be angularly adjusted relative to the hub 205. The transfer arms 210 may be detachable from the hub 205. In some embodiments, the transfer arms 210 are mechanically coupled to the hub 205, such as by one or more fastening members, such as bolts or screws.

The hub 205 includes a plurality of arm fixing areas 215. The plurality of arm fixing areas 215 may be configured to allow a first (inner or a proximal) end 220 of each of the transfer arms 210 to be coupled to the hub 205. The first end 220 of the transfer arms 210 are positioned radially inward of a second (outer or distal) end 225 of the transfer arms 210. The first end 220 includes a mounting region 226 of the transfer arm 210 that is coupled to the hub 205. The second end 225 of each of the transfer arms 210 includes a substrate-supporting member 236. In one embodiment, the substrate-supporting member 236 of the second end 225 of the transfer arms 210 form a partial ring. The partial ring of the second end 225 may form more than a semicircle, such that the partial ring is greater than 180 degrees.

In some embodiments, the indexer 200 is a mechanical assembly that includes at least one degree of freedom. In one configuration, the indexer 200 is capable of rotating about a rotational axis 245, but the transfer arms 210 are not equipped to move in any direction other than a rotational direction by use of a rotational motor 262. In another configuration, the indexer 200 is capable of rotating about a rotational axis 245 by use of the rotational motor 262, and moving in a direction parallel to the rotational axis 245 by use of a vertical actuator 264.

At least a portion of the transfer arms 210 include a plurality of electrical interface connections 250a, 250b positioned on the substrate-supporting member 236 of the second end 225. The electrical interface connections 250a, 250b are utilized to provide electrical power to or through the transfer arms 210 to a component that is supported on the substrate-supporting member 236 of the transfer arm 210. The electrical interface connections 250a, 250b may be electrical contact pins extending from a surface of the substrate-supporting member 236 of the second end 225 of the transfer arms 210. Each of the electrical interface connections 250a, 250b are configured to provide electrical power to electrical components (e.g., heater elements, electrostatic chucking electrodes, contact pads) disposed on the surface of the substrate-supporting member 236. The electrical interface connections 250a, 250b may be fixed or compliant. The electrical interface connections 250a, 250b may be positioned on one, two, or three tines of a fork 255 of the second end 225 of the transfer arms 210. Each of the electrical interface connections 250a, 250b can be a different or same size. For example, the electrical interface connection 250b may be smaller than electrical interface connection 250a.

Figure 2B:
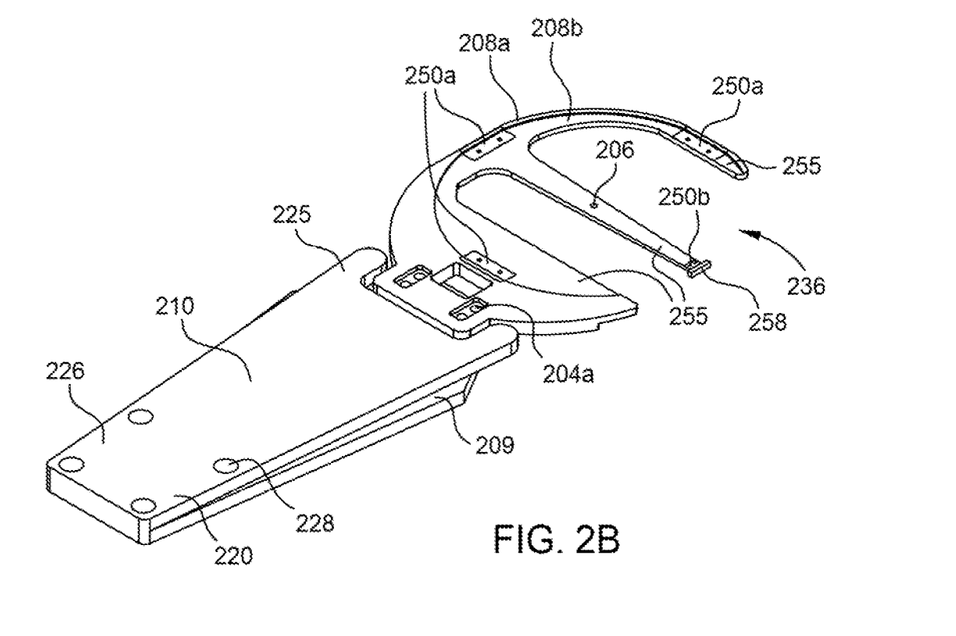
FIG. 2B is an isometric view of a portion of one of the transfer arms of the indexer of FIG. 2A according to at least one embodiment of the present disclosure.
Figure 2C:
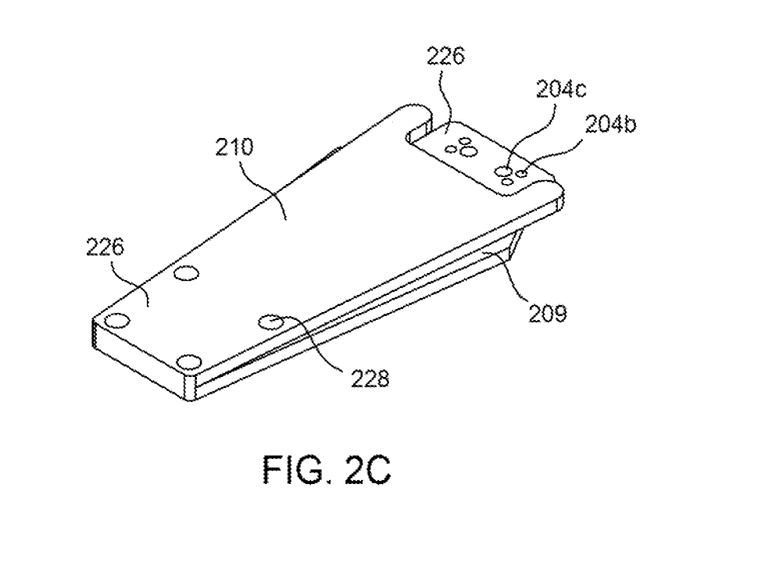
FIG. 2C is an isometric view of a portion of one of the transfer arms of the indexer of FIG. 2A according to at least one embodiment of the present disclosure.

FIG. 2B is an isometric view of a portion of one of the transfer arms 210 with substrate-supporting member 236 of the indexer 200 of FIG. 2A according to at least one embodiment of the present disclosure, and FIG. 2C is an isometric view of a portion of one of the transfer arms of the indexer 200 of FIG. 2A according to at least one embodiment of the present disclosure. The transfer arm 210 includes the first end 220 and the second end 225. The first end 220 includes the mounting region 226 of the transfer arm 210 that is coupled to the hub 205. In some embodiments, the transfer arms 210 are mechanically coupled to the hub 205, such as by one or more fastening members, such as bolts or screws, passing through holes 228 of the transfer arm 210.

The second end 225 of each of the transfer arms 210 includes the substrate-supporting member 236. In this embodiment, the transfer arm 210 includes a non-uniform geometry in order to improve structural stiffness, reduce mass and reduce heat transfer between the second end 225 and the first end 220. One will note that these design goals each have competing effects and thus must be balanced to achieve a desirable design. For example, increasing a transfer arm's stiffness will undesirably increase its mass (i.e., increase rotational inertia) and undesirably increase the ability of the transfer arm to conduct heat between the first end 220 and the second end 225. As shown, side 209 of transfer arm 210 has an increased thickness towards second end 225. The change in thickness from the first end 220 to the second end 225 improves the mechanical droop over existing state-of-the-art systems.

The substrate-supporting member 236 is coupled to the transfer arm 210 by fastening members, e.g., screws or bolts, passing through holes 204a of the substrate-supporting member 236 and holes 204b, 204c of the mounting region 226 of the transfer arm 210. The substrate-supporting member 236 has an upper surface 208a and a lower surface 208b, enabling a substrate disposed on the substrate-supporting member 236 to slide back into position in case of substrate misplacement.

The substrate-supporting member includes tines of the fork 255. A plurality of the electrical interface connections 250a, 250b (4 shown) are positioned on the three tines of the fork 255 of the substrate-supporting member 236. The substrate-supporting member 236 includes an opening 206 (e.g., an alignment feature) for system calibration. The opening 206 can be a clearance that enables positional adjustability of the substrate-supporting members (e.g., substrate holders), enabling an initial one-time calibration, and replacing complex active correction robots of conventional systems. In some embodiments, calibration can be performed by the following operation. The opening 206 (or alignment feature) on each transfer arm 210 can be aligned with a first process station (of the plurality of process stations 160) that receives the substrate. The remaining process stations of the plurality of process stations 160 have a center axis adjustable to align with the opening 206 of the first transfer arm 210. The adjustment of the opening 206 can be attained by adjusting screws at the through holes 204a.

Figures 2D, 2E:
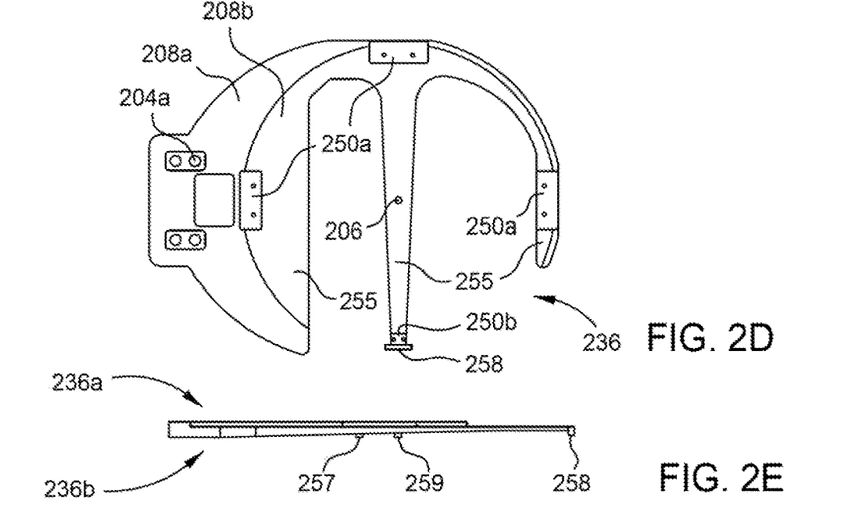
FIG. 2D is a top view of a portion of one of the transfer arms of the indexer of FIG. 2A according to at least one embodiment of the present disclosure according to at least one embodiment of the present disclosure.
FIG. 2E is a side view of a portion of one of the transfer arms shown in FIG. 2D according to at least one embodiment of the present disclosure according to at least one embodiment of the present disclosure.

FIG. 2D shows a top view of the substrate-supporting member 236 discussed in relation to FIG. 2B. FIG. 2E shows a side view of the substrate-supporting member 236. The substrate-supporting member 236 has a top side 236a and a bottom side 236b. The bottom side 236b can be tapered (as shown) to reduce weight.

The substrate-supporting member 236 has one or more embossments 257, 259 (two shown) for providing sufficient material thickness in that local area at the bottom side (236b) of substrate-supporting member 236. Feature 258 provides an additional surface to attach electrical interface connection 250b.

Figure 2F:
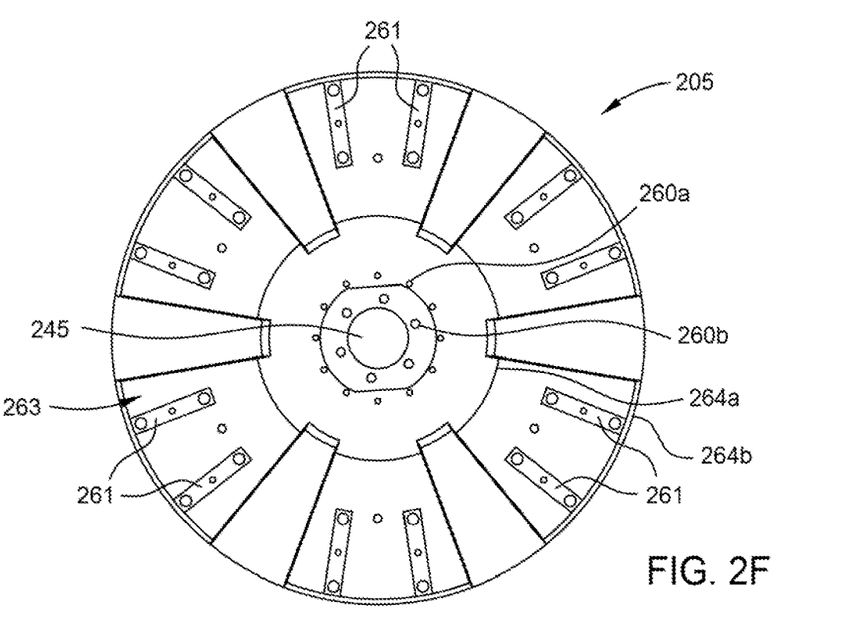
FIG. 2F is a bottom view of a portion of the hub of the indexer of FIG. 2A according to at least one embodiment of the present disclosure.
Figure 2G:
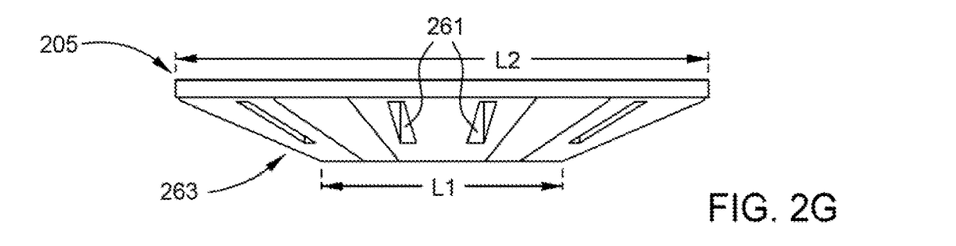
FIG. 2G is an isometric view of a portion of the hub of the indexer of FIG. 2A according to at least one embodiment of the present disclosure.
Figure 2H:
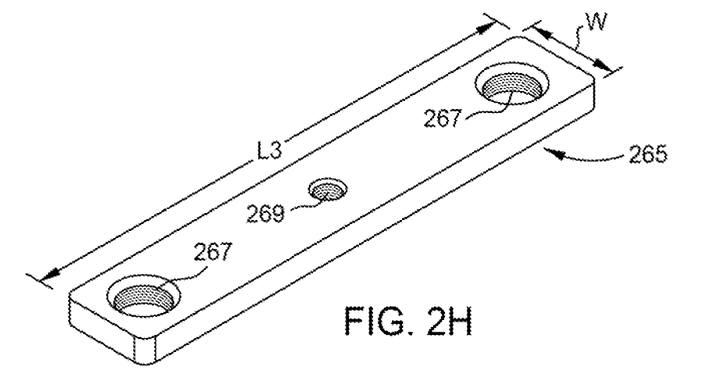
FIG. 2H is an isometric view of a nut sector for mounting a transfer arm to the hub of the indexer of FIG. 2A according to at least one embodiment of the present disclosure.

FIG. 2F shows a bottom view of the hub 205, and FIG. 2G shows a side view of the hub 205 according to some embodiments. FIG. 2H shows an isometric view of a nut sector 265, which is coupled to regions 261 of the hub 205, enabling coupling of the transfer arm 210 to the hub 205. The nut sector 265 has a variable length (L3) and width (W) that can be chosen based on the size of the associated hardware. Screws/bolts are passed through holes 228 of the transfer arm 210, regions 261, and threaded through holes 267 of nut sector 265 to enable coupling of the transfer arms 210 to the hub 205. As shown, an additional threaded through hole 269 of nut sector 265 is used to couple the nut sector 265 with the hub 205. Referring to FIG. 2G, in some embodiments, sections 263 of hub 205 have a sloped surface extending from an inner radius 264a of the hub 205 to an outer radius 264b of the hub 205. The steeped surface provides strengthening of the hub 205 and the transfer arm 210. Lengths L1 and L2 of the sections 263 can be variable so long as L1 is shorter than L2. Through holes 260b are used for assembling the hub 205 to a spacer (not shown), while optional through holes 260a allow assembly to other components (not shown).

Figure 2I:
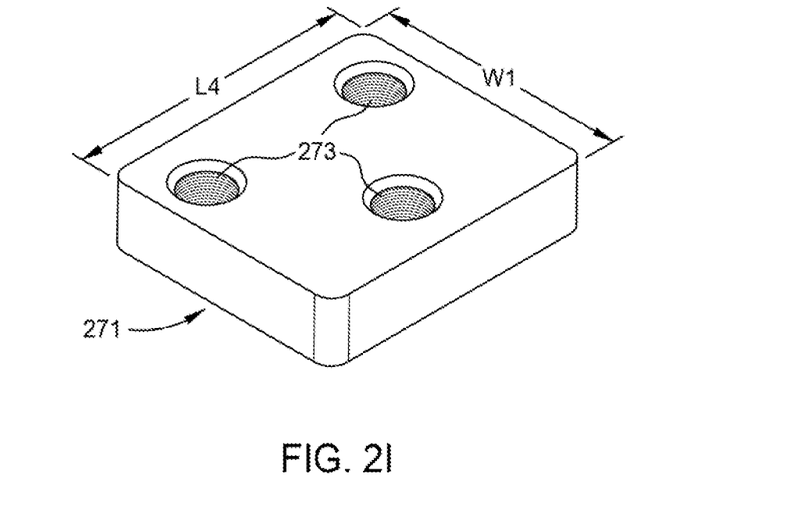
FIG. 2I is an isometric view of a nut sector for mounting a transfer arm to the substrate-supporting member of the indexer of FIG. 2A according to at least one embodiment of the present disclosure.

FIG. 2I shows an isometric view of a nut sector 271 having through holes 273 (which can be threaded through holes) for mounting the transfer arm 210 to the substrate-supporting member 236. For example, screws/bolts can be screwed/bolted through the through holes 204a of the substrate-supporting member 236, the through holes 204b, 204c of the mounting region 226 of the transfer arm 210, and threaded through holes 273 of the nut sector 271. The nut sector 271 can have a variable length 4 (L4) and width 1 (W1) that can be chosen based on the size of the associated hardware.

Figure 2J:
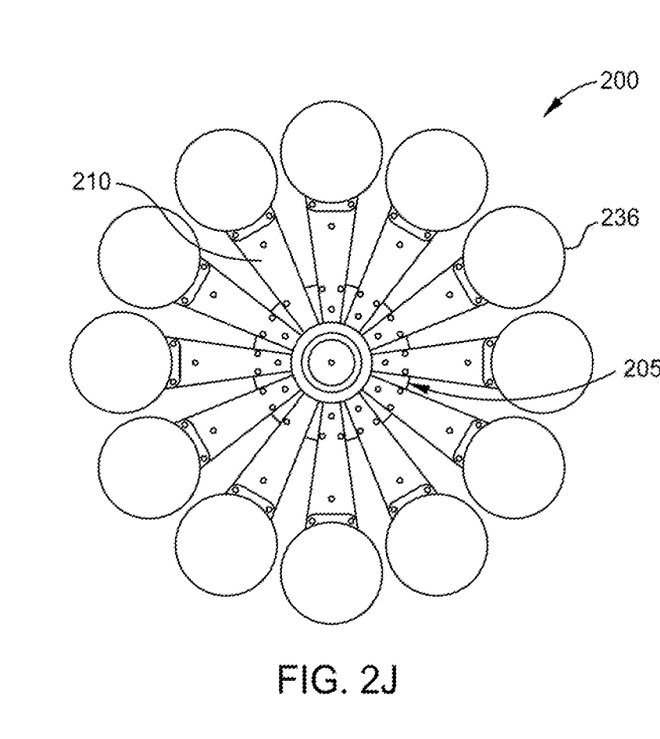
FIG. 2J is a plan view of one embodiment of an indexer that may be used in the central transfer apparatus of FIG. 1 according to at least one embodiment of the present disclosure.
Figure 2K:
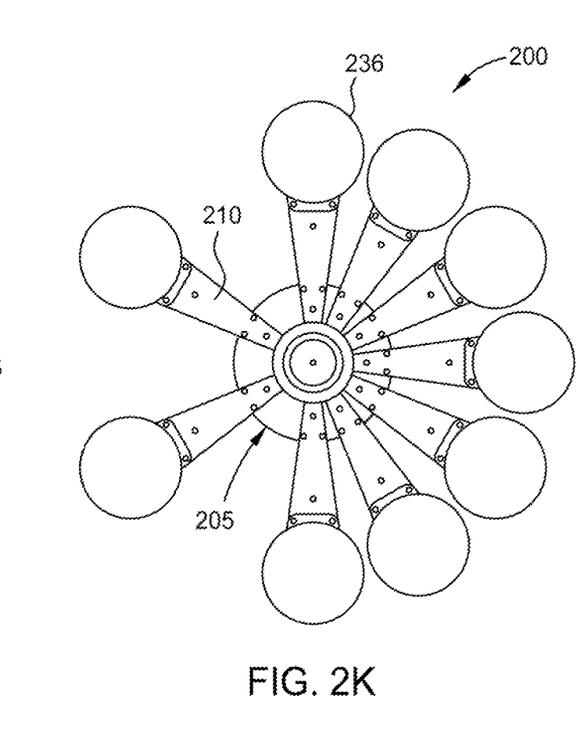
FIG. 2K is a plan view of one embodiment of an indexer that may be used in the central transfer apparatus of FIG. 1 according to at least one embodiment of the present disclosure.

The indexer 200 may be equipped with any number of transfer arms 210. FIGS. 2J and 2K illustrate examples of different transfer arm 210 configurations that can be used in an indexer 200, and are different from the transfer arm 210 configuration of the indexer 200 illustrated in FIG. 2A. In some embodiments, the transfer arms 210 shown on the indexer 200 in FIGS. 2J and 2K can include chuck assemblies (not shown) that are configured to support a substrate on a substrate receiving surface formed thereon (i.e., top surface of the chuck assemblies).

The number of transfer arms 210 may be an even number or odd number. For example, the indexer 200 may have 2, 3, 4, 5, 6, 7, 8, 9, 10, 11, 12, or any higher number of transfer arms 210 that is higher. An example of a 12 transfer arm 210 configuration is illustrated in FIG. 2J. The number of transfer arms 210 may equal the number of process stations 160 (shown in FIG. 1). In some embodiments, there may be more transfer arms 210 in one sector of the indexer 200 than another sector such that the indexer 200 is differently loaded (such as 3 transfer arms 210 in one sector that spans about half the circumference about the rotational axis 245 and 6 transfer arms 210 on the other side of the rotational axis 245 as shown in FIG. 2K).

Figure 3:
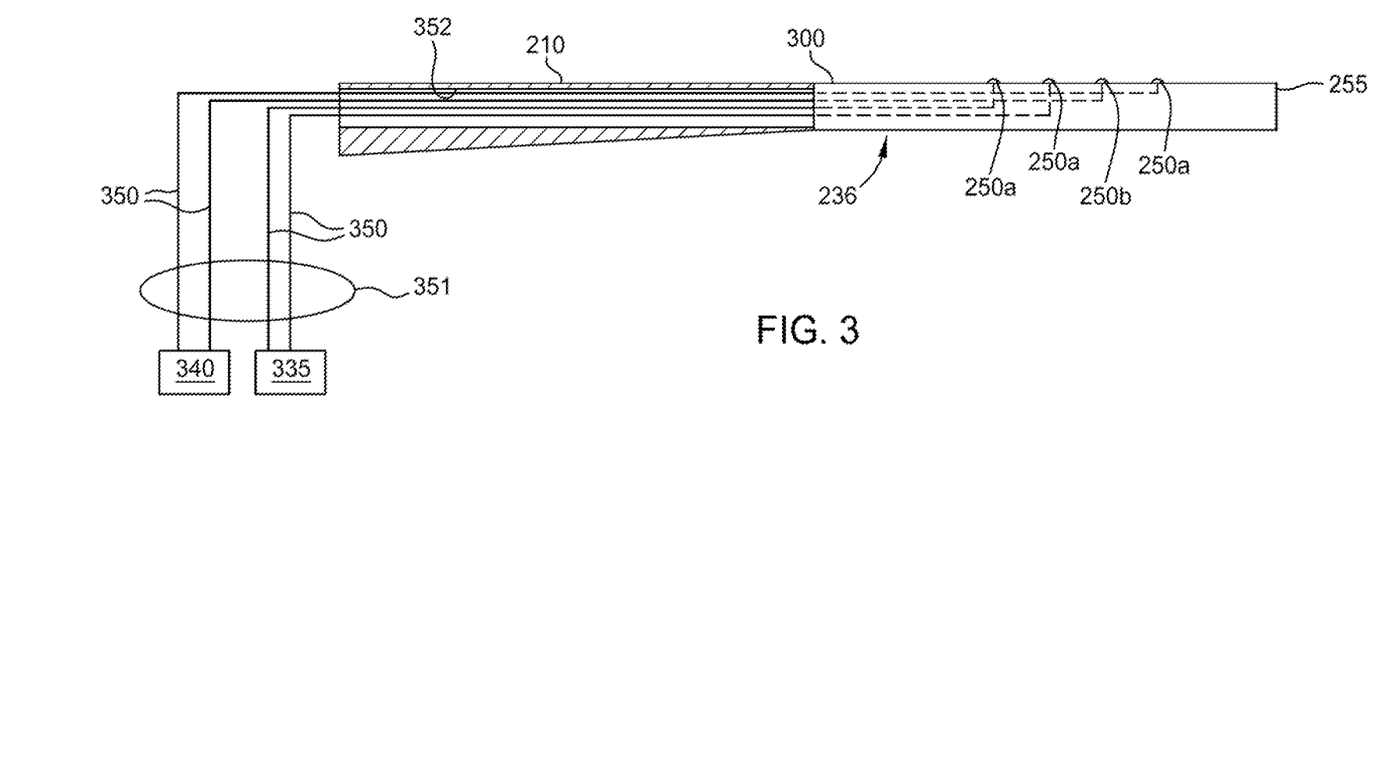
FIG. 3 is a schematic sectional side view of a portion of one of the transfer arms of the indexer of FIG. 2A according to at least one embodiment of the present disclosure.

FIG. 3 is a schematic sectional side view of a portion of one of the transfer arms 210 of the indexer 200 of FIG. 2A. The electrical interface connections 250a, 250b are shown on the fork 255 of the second end 225 of the transfer arm 210. Also shown is a substrate receiving surface 300 of the substrate-supporting member 236 at the fork 255. Chucking of the substrates allows for, e.g., substrate movement at variable speeds for high throughput. Each of the electrical interface connections 250a, 250b may be shaped as a protruding member.

Each of the electrical interface connections 250a, 250b are configured to provide electrical power to chucking/contact pads or electrostatic chucks while a substrate is positioned on the substrate-supporting member 236. The chucking/contact pads or electrostatic chucks may be part of the electrical interface connections 250a, 250b or a separate component coupled to the electrical interface connections 250a, 250b. In an example, at least one of electrical interface connections 250a, 250b are coupled to a chucking power source 340, through a rotational coupling assembly 351 (e.g., slip ring), that provides direct current (DC) power to an electrostatic chuck (not shown). In another example, at least one of electrical interface connections 250a, 250b can be coupled to a heater power source 335, through the rotational coupling assembly 351, that provides alternating current (AC). Conductors or wires 350 are routed through each transfer arm 210, which is positioned within the vacuum region of the transfer chamber assembly 150, to the electrical interface connections 250a, 250b. The wires 350 are routed through an opening or through-hole 352 formed in the transfer arm 210. The wires 350 may alternatively or additionally be routed through a channel (not shown) formed in a surface of the transfer arm 210.

Figure 4:
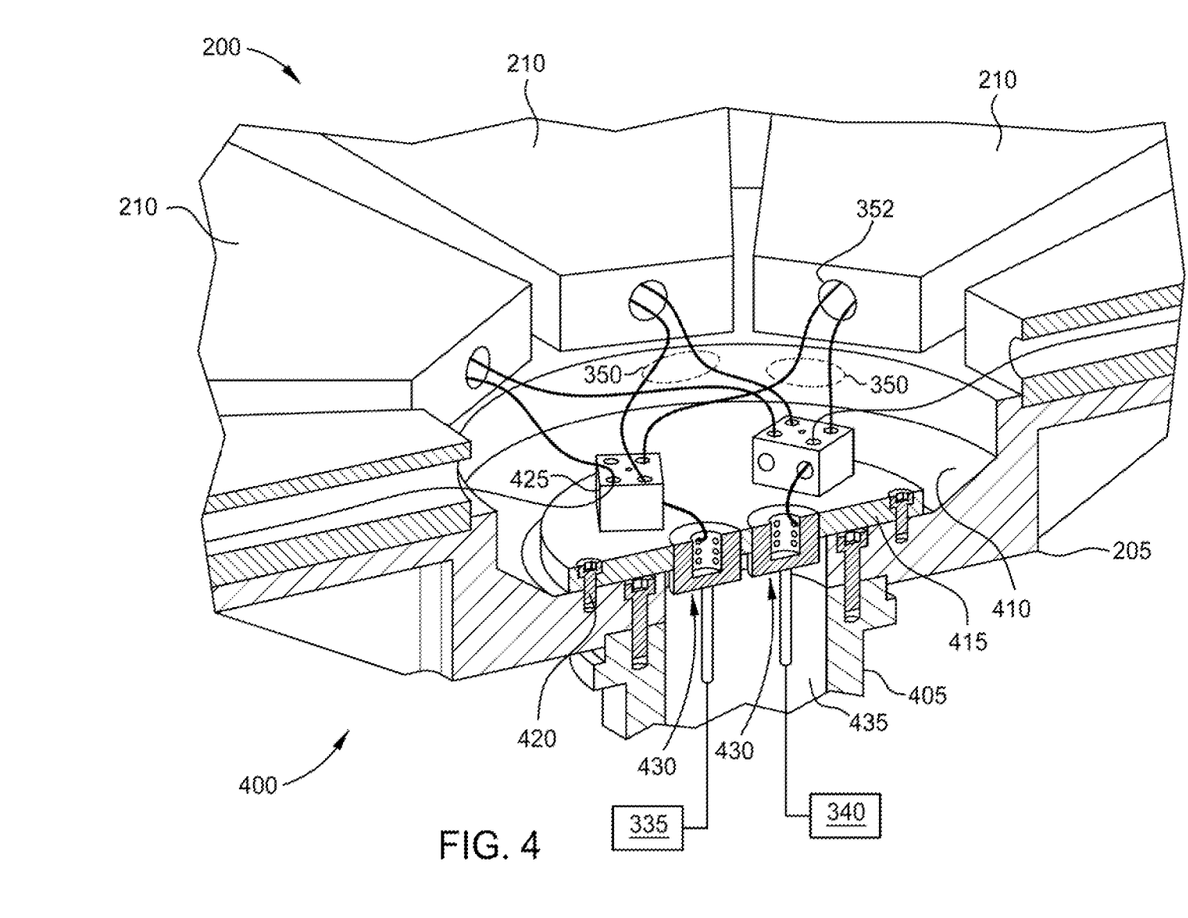
FIG. 4 is a schematic sectional isometric view of a shaft assembly for the indexer according to at least one embodiment of the present disclosure.

FIG. 4 is an isometric sectional view of a shaft assembly 400 according to one embodiment of the indexer 200. The shaft assembly 400 includes a hollow shaft 405 that is coupled to the hub 205. Each of the plurality of transfer arms 210 is coupled to the hub 205. The hub 205 includes a recessed portion 410 formed in a center thereof. A central cap 415 of the hub 205 is disposed in the recessed portion 410. The central cap 415 is utilized to fix the hub 205 to the hollow shaft 405, for example, using fasteners 420.

The central cap 415 includes a plurality of terminal blocks 425 mounted thereon. Each of the terminal blocks 425 may be made of a ceramic material or a polymer, such as polyether ether ketone (PEEK). Each of the terminal blocks 425 provide electrical power from a plurality of sealed feed-throughs 430 formed between the hollow shaft 405 and the central cap 415. The sealed feed-throughs 430 may be a vacuum-tight electrical feed-through that is configured to transfer power from an interior volume 435 of the hollow shaft 405, which is at ambient or atmospheric pressures while the transfer arms 210 and upper portion of the hub 205 and other portions connected thereto are positioned within a transfer region that is at a negative pressure during use.

The feed-throughs 430 are separately coupled to the heater power source 335 (AC) and the chucking power source 340 (DC). Typically, one of each power source is operably coupled to each transfer arm 210. Wires are provided to the terminal blocks 425 from the feed-through 430 to the terminal blocks 425, and wires 350 are provided from the terminal blocks 425 on or through each of the plurality of transfer arms 210 to supply power to the electrical interface connections 353 (shown in FIG. 3). In one embodiment, wires 350 from the terminal blocks 425 are routed via through-holes 352 formed in each of the plurality of transfer arms 210.

Embodiments described herein enable transfer of more than two substrates simultaneously and provide improved mechanical droop over existing systems. The initial adjustability for system calibration replaces active correction systems having a large number of systems, thereby reducing the number of components and improving system reliability. The chucking enabled by electrical interface connections avoids slippage at higher speeds, and a centralized feed-through for all electrical connections enables isolation from the atmosphere to vacuum. Further, the controlled heating and cooling of the system improves the green-to-green time of system.

It is to be understood that the disclosure is not limited to the details of construction or process steps set forth in the following description. It is envisioned that some embodiments of the present disclosure may be combined with other embodiments.

While the foregoing is directed to embodiments of the present disclosure, other and further embodiments of the disclosure may be devised without departing from the basic scope thereof, and the scope thereof is determined by the claims that follow.

What is claimed is:

1. An apparatus for transferring a substrate, comprising:
    a hub;
    a plurality of transfer arms extending from the hub;
    a plurality of substrate-supporting members, each substrate-supporting member includes an opening for positioning the substrate-supporting member, each of the transfer arms has a first end coupled to the hub and a second end coupled to a respective one of the plurality of substrate-supporting members, and each transfer arm tapers in thickness from the second end of the transfer arm to the first end of the transfer arm;
    a first electrical interface connection for electrostatically chucking a substrate and located at a first position on each substrate-supporting member; and
    a second electrical interface connection for electrostatically chucking the substrate and located at a second position on each substrate-supporting member.

2. The apparatus of claim 1, wherein the hub is rotatable when the first and second electrical interface connections are electrically connected to a power supply.

3. The apparatus of claim 1, further comprising a third electrical interface connection for electrostatically chucking the substrate and located at a third position on each substrate-supporting member.

4. The apparatus of claim 1, further comprising a plurality of electrical wires for providing power to the electrical interface connections, a portion of the plurality of electrical wires routed through each transfer arm and through an opening of the hub to a power supply.

5. The apparatus of claim 1, wherein each substrate-supporting member has:
    a top surface for supporting a substrate; and
    a tapered bottom surface.

6. The apparatus of claim 1, wherein the hub has:
    a top surface coupled to the plurality of transfer arms; and
    a bottom surface having a steeped surface extending from an inner radius of the hub to an outer radius of the hub.

7. An apparatus for transferring a substrate, comprising:
    a hub;
    a plurality of transfer arms extending from the hub;
    a plurality of substrate-supporting members, each substrate-supporting member includes an opening for positioning the substrate-supporting member, each of the transfer arms has a first end coupled to the hub and a second end coupled to a respective one of the plurality of substrate-supporting members, and each transfer arm tapers in thickness from the second end of the transfer arm to the first end of the transfer arm; and
    a plurality of electrical interface connections distributed about the substrate-supporting members, the plurality of electrical interface connections for electrostatically chucking a substrate, wherein the hub is rotatable when the plurality of electrical interface connections are electrically connected to a power supply.

8. The apparatus of claim 7, wherein each substrate-supporting member comprises two or more tines.

9. The apparatus of claim 8, wherein one or more of the plurality of electrical interface connections is located on a surface of the two or more tines.

10. The apparatus of claim 7, further comprising a plurality of electrical wires for providing power to the electrical interface connections, a portion of the plurality of electrical wires routed through each transfer arm and through an opening of the hub to a power supply, the opening of the hub defining a rotation axis of the hub.

11. The apparatus of claim 7, wherein each substrate-supporting member has:
    a top surface for supporting a substrate; and
    a tapered bottom surface.

12. A substrate processing module, comprising:
    a transfer apparatus positioned within a transfer region of the substrate processing module, the transfer region configured to operate under vacuum, the transfer apparatus comprising:
        a hub;
        a plurality of transfer arms extending from the hub;
        a plurality of substrate-supporting members, each substrate-supporting member includes an opening for positioning the substrate-supporting member, each of the transfer arms has a first end coupled to the hub and a second end coupled to a respective one of the plurality of substrate-supporting members, and each transfer arm tapers in thickness from the second end of the transfer arm to the first end of the transfer arm;

a first electrical interface connection for electrostatically chucking a substrate and located at a first position on each substrate-supporting member; and a second electrical interface connection for electrostatically chucking the substrate and located at a second position on each substrate-supporting member.

13. The substrate processing module of claim 12, wherein the hub is rotatable when the first and second electrical interface connections are electrically connected to a power supply.

14. The module of claim 12, further comprising a plurality of electrical wires for providing power to the electrical interface connections, a portion of the plurality of electrical wires routed through each transfer arm and through an opening of the hub to a power supply.

* * * * *